(12) United States Patent
Tate

(10) Patent No.: US 6,861,862 B1
(45) Date of Patent: Mar. 1, 2005

(54) TEST SOCKET

(76) Inventor: John O. Tate, 9 Morgan Ct., Lincoln, RI (US) 02865

( * ) Notice: Subject to any disclaimer, the term of this patent is extended or adjusted under 35 U.S.C. 154(b) by 38 days.

(21) Appl. No.: 10/387,841

(22) Filed: Mar. 17, 2003

(51) Int. Cl.⁷ .......................... G01R 31/02; H01R 13/24
(52) U.S. Cl. ........................ 324/761; 324/758; 439/700
(58) Field of Search ................................ 324/754, 755, 324/758, 761, 765; 439/482, 700, 744, 824

(56) References Cited

U.S. PATENT DOCUMENTS

| | | | |
|---|---|---|---|
| 2,696,535 A | | 12/1954 | McLean et al. |
| 3,728,667 A | | 4/1973 | Richelmann |
| 3,968,433 A | | 7/1976 | Dobarganes |
| 4,010,993 A | * | 3/1977 | Hohenberger et al. ...... 439/176 |
| 4,632,485 A | | 12/1986 | Brown et al. |
| 4,675,599 A | | 6/1987 | Jensen et al. |
| 4,686,465 A | | 8/1987 | Kruger |
| 4,913,286 A | | 4/1990 | Tate |
| 5,015,946 A | | 5/1991 | Janko |
| 5,122,070 A | | 6/1992 | Lebris et al. |
| 5,151,040 A | | 9/1992 | Tanaka |
| 5,877,554 A | | 3/1999 | Murphy |
| 6,036,503 A | | 3/2000 | Tsuchida |
| 6,100,585 A | | 8/2000 | Chiba |
| 6,190,181 B1 | | 2/2001 | Affolter et al. |
| 6,213,787 B1 | | 4/2001 | Murphy |
| 6,220,870 B1 | | 4/2001 | Barabi et al. |
| 6,249,440 B1 | | 6/2001 | Affolter |
| 6,270,356 B1 | | 8/2001 | Hoshino et al. |
| 6,352,437 B1 | | 3/2002 | Tate |

* cited by examiner

*Primary Examiner*—David Zarneke
*Assistant Examiner*—Russell M. Kobert
(74) *Attorney, Agent, or Firm*—Salter & Michaelson

(57) ABSTRACT

A test socket including a contactor having a distal end which is received within a tapered retainer for guiding the distal end of the contactor and into a terminal housing having a counterbore such that movement of the distal end of the contactor is restricted by the counterbore of the terminal is disclosed.

16 Claims, 8 Drawing Sheets

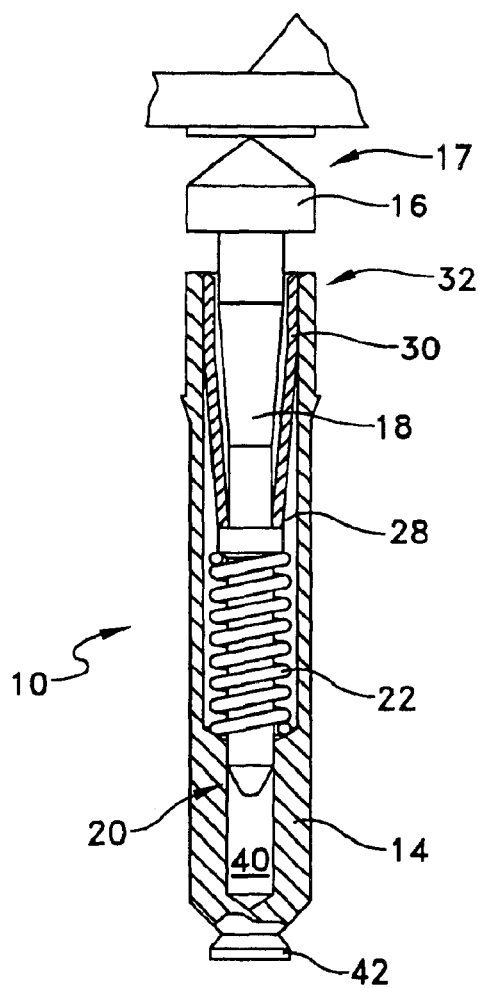
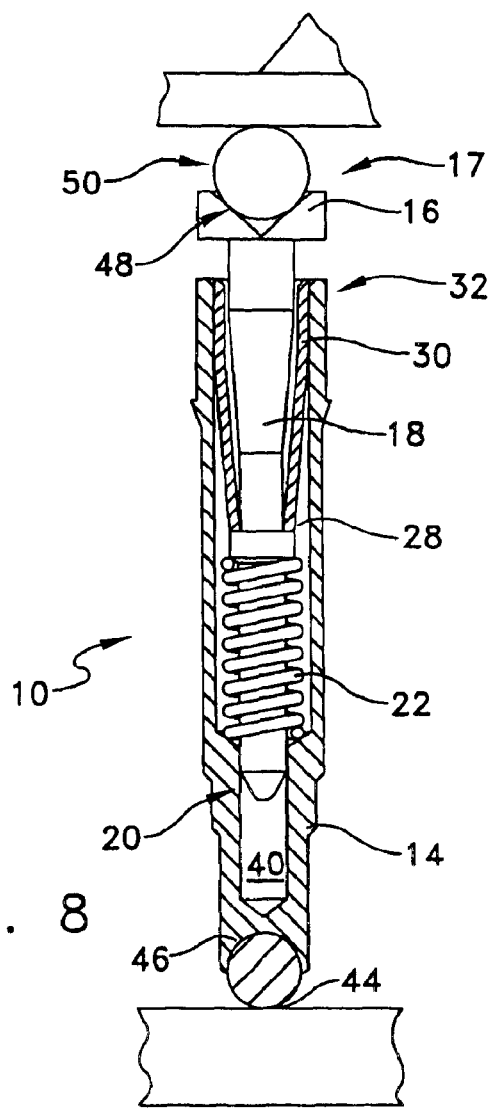
FIG. 7
FIG. 8

TEST SOCKET

DESCRIPTION

1. Technical Field

The invention relates generally to a test socket, and more particularly to a test socket which has improved axial alignment and which provides a direct electrical path from a device under test to a printed circuit board.

2. Background of Related Art

It is well known in the art to use test sockets for the testing of electronic circuits. Conventional test sockets have a plurality of contactors, springs and retainers which are assembled into a terminal that forms the conductive element of the test socket. An insulator is also generally provided consisting of a base into which the contactor assembly is held. A guide accurately positions the device under test (DUT), which also may include devices such as a ball grid array (BGA), land grid array (LGA), and a column grid array (CGA). A cover is also provided, which is attached to the guide and base after the DUT is placed on top of the base; and several devices are provided for compressing the cover on top of the DUT to the base. In use, as the cover is tightened down the contactors are compressed to make electrical contact at the engaging end of the contactor. The engaging end may be configured with a variety of designs which include, for example, a cup, a counterbore or countersink to accept a BGA, and a single pointed, multi pointed, spear or chisel shape to make contact to the flat LGA. In order for the testing to be accurate, the electrical path from the device under test to the printed circuit board should be optimized so as to minimize electrical resistance. A variety of test sockets have been developed to improve the testing of such electronic circuits.

For example, U.S. Pat. No. 5,877,554 to Murphy discloses a converter socket terminal for making interconnections between the electrical contacting areas of an array package and the connection regions of a printed circuit board. The socket terminal assembly includes a contact spring disposed within an opening of a socket body to receive and apply a frictional force sufficient to retain a pin within the opening of the socket body. The socket terminal assembly also includes a resilient member disposed within the opening to apply, in response to a downward force applied to the pin, an upward force to the pin sufficient to overcome the frictional force of the contact spring. The pin has an end adapted to contact an electrical contacting area of an integrated circuit package and an opposite end configured to be inserted within the opening of the socket body. An intercoupling component includes a socket support member having holes, each hole receiving a corresponding socket terminal assembly.

U.S. Pat. No. 4,913,286, invented by the present Applicant, discloses a socket terminal carrier assembly including a plurality of pins (14) which engage socket terminals (16). The carrier pins (14) include enlarged heads (26), reduced main body portions (28) having annular barbs (30) thereon, tapered intermediate end portions (32), and reduced, cylindrical terminal end portions (34) which terminate in terminal end elements (35). The socket terminals (16) include enlarged upper socket portions (36), reduced cylindrical main body portions (38) having enlarged annular barbs (40) thereon, and elongated terminal pin portions (42). The socket terminals (16) are assembled on the terminal end portions (34) of the carrier pins (14) so that the ends of internal contact fingers (43a) of the socket terminals (16) engage terminal end elements (35) to the carrier pins (14) to retain the socket terminals (16) on the carrier pins (14).

While generally acceptable, conventional test sockets do not maintain stable axial alignment, i.e. perpendicularity, during use because they are uncontrolled at the upper and lower portion of the contactors. Thus, there is a continued need in the art for test sockets which further improve the accuracy of testing electronic circuits, particularly in maintaining stable axial alignment of the test socket during use.

SUMMARY

It is an object of the test socket disclosed herein to provide stable axial alignment in order to improve the testing of the device under test, and to provide a direct electrical path from the device under test to the printed circuit board. The test socket preferably includes a contactor having a distal end which is received within a retainer having a tapered inner diameter for guiding the distal end of the contactor, and into a terminal housing which includes a counterbore such that movement of the distal end of the contactor is restricted by the counterbore of the terminal. In use, the contactor assembly is disposed within the terminal housing such that the contactor moves substantially in an up and down, or axial direction. In addition, the contactor assembly is in electrical contact with the terminal housing, so that a direct electrical path is formed between the device under test (DUT) and the printed circuit board, without going through the spring of the contactor assembly.

BRIEF DESCRIPTION OF THE DRAWINGS

It should be understood that the drawings are provided for the purpose of illustration only and are not intended to define the limits of the invention. The foregoing and other objects and advantages of the embodiments described herein will become apparent with reference to the following detailed description when taken in conjunction with the accompanying drawings in which:

FIG. 7 is a side cross sectional view of a first alternate embodiment of a test socket according to the invention;

FIG. 8 is a side cross sectional view of a second alternate embodiment of the test socket according to the invention;

DETAILED DESCRIPTION OF THE ILLUSTRATIVE EMBODIMENTS

Figure 1:
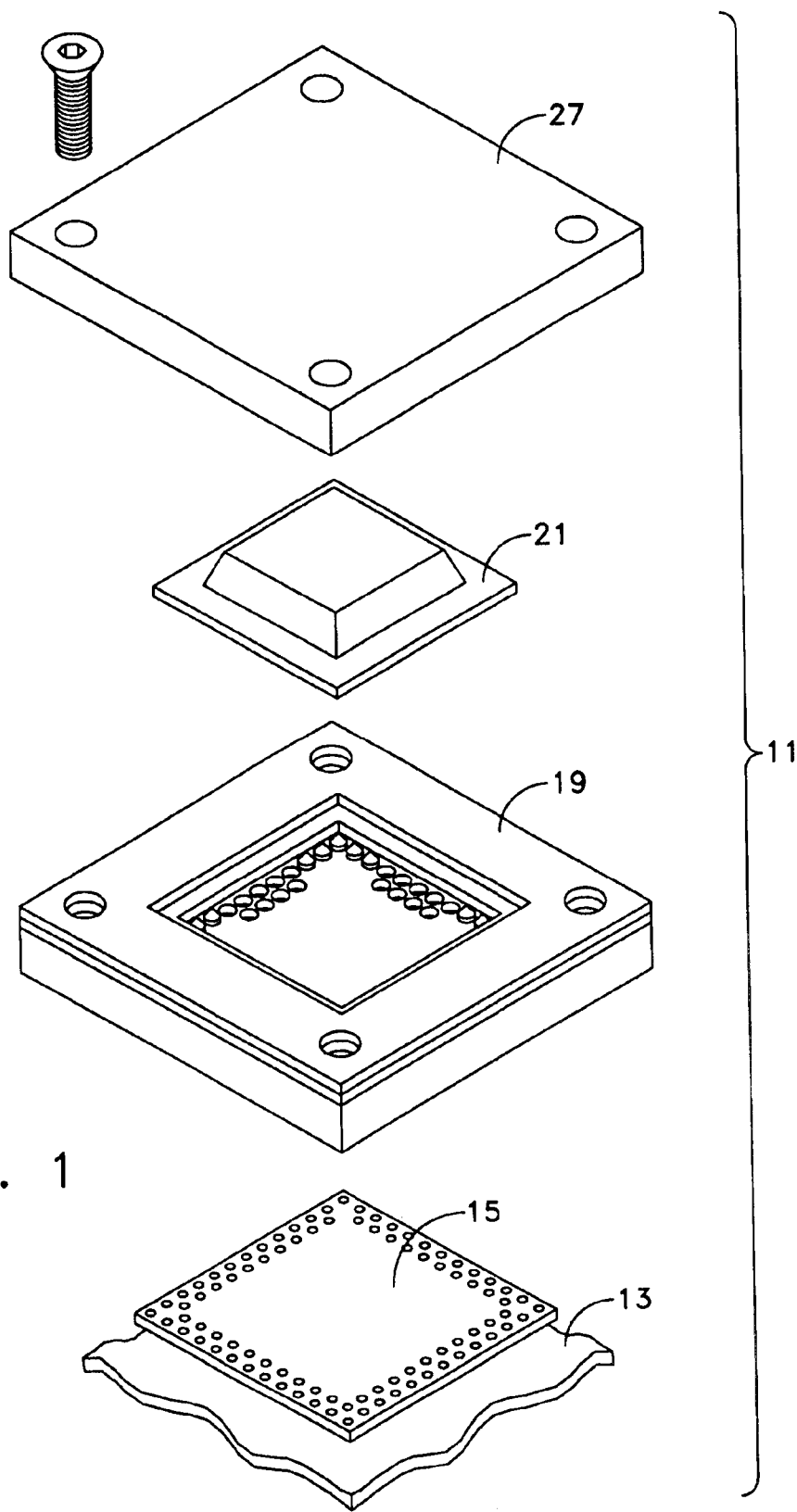
FIG. 1 is an exploded view of a test assembly for testing of electronic circuits.
Figure 2:
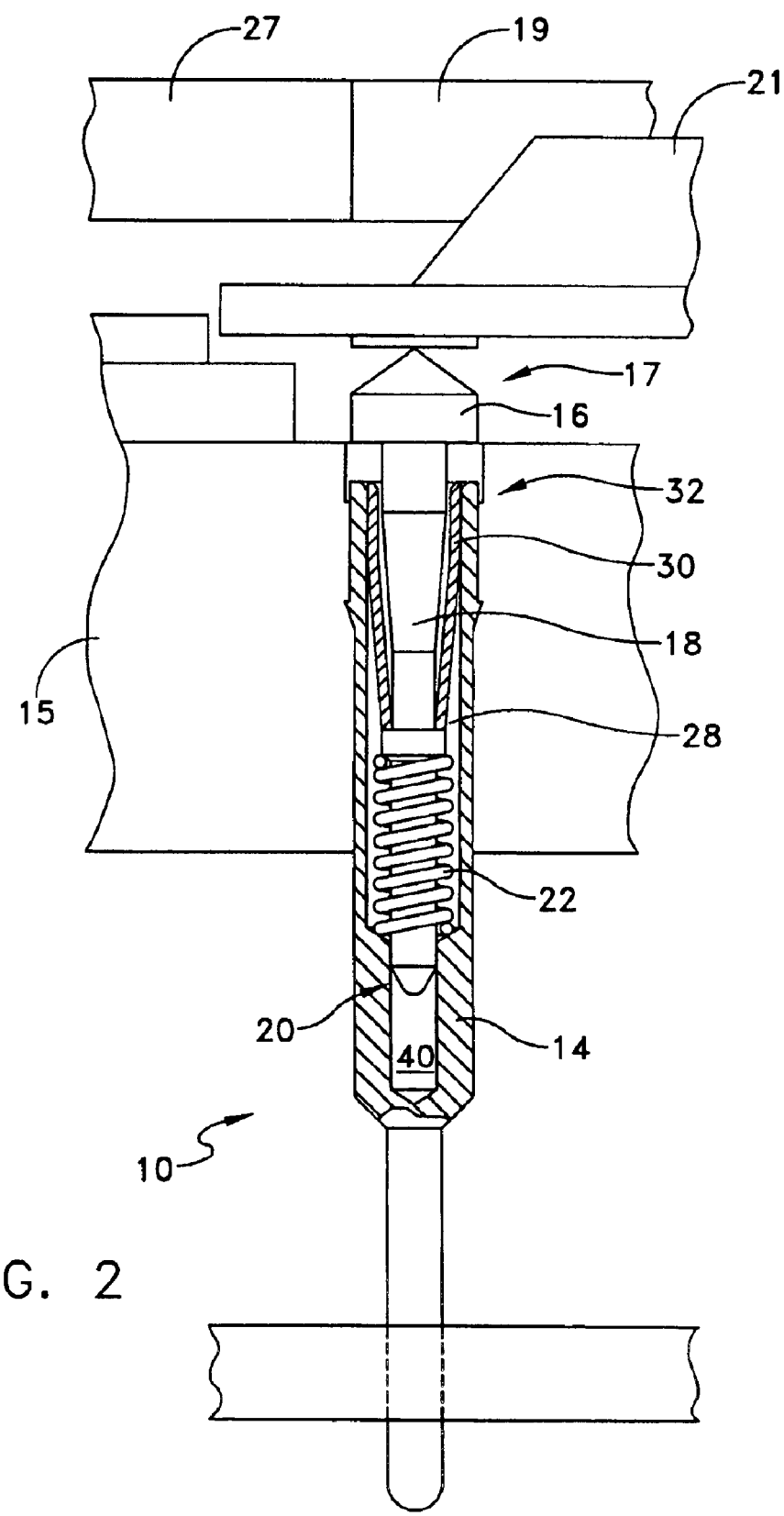
FIG. 2 is a side view of a test socket in partial perception according to the present invention in use with a conventional test assembly.
Figure 3:
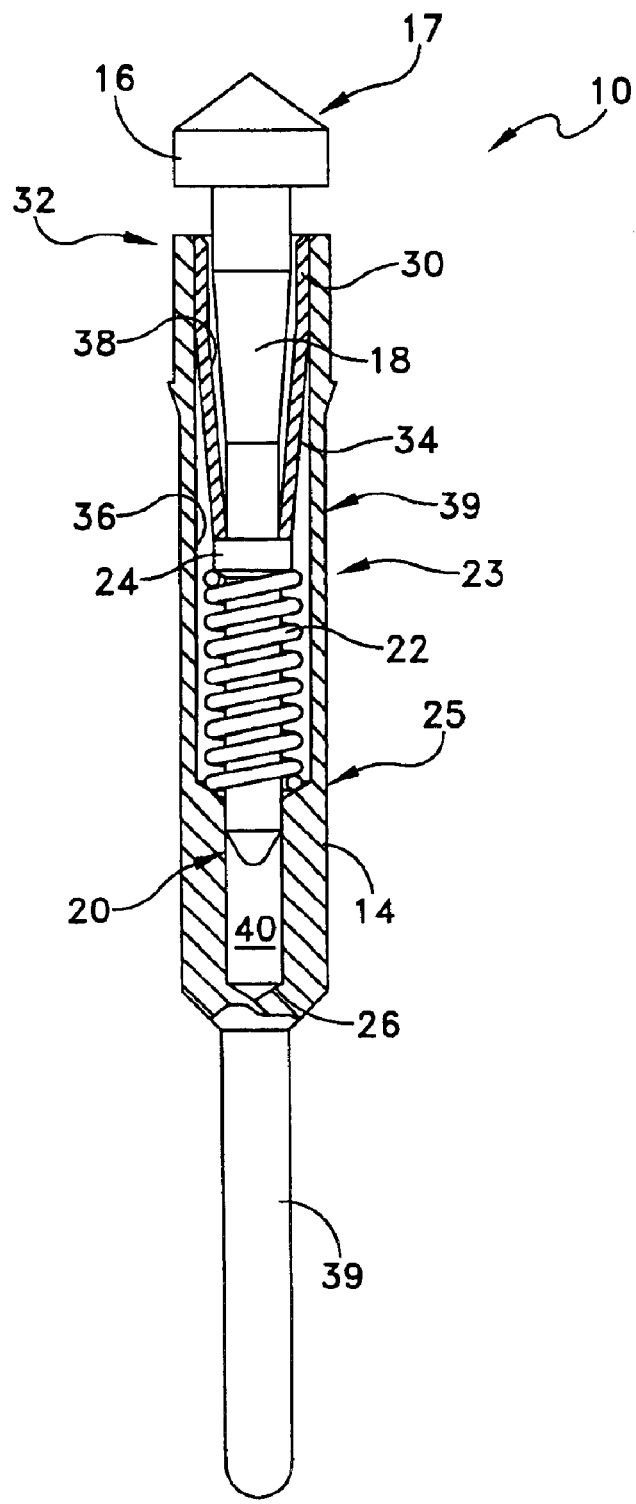
FIG. 3 is a side view and partial cross section of the test socket of FIG. 2.
Figure 4:
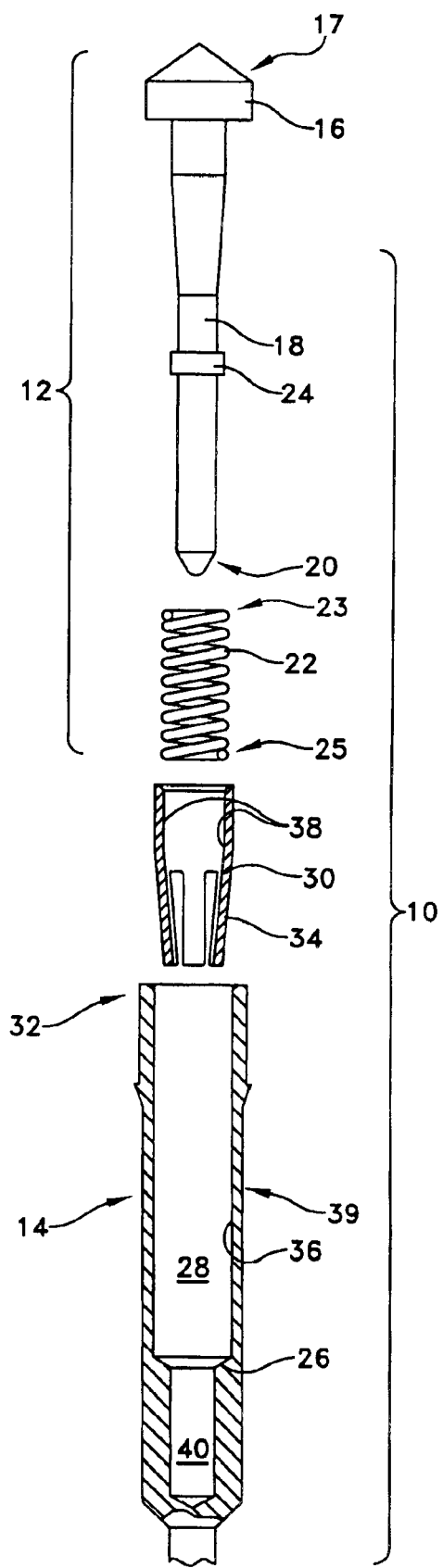
FIG. 4 is an exploded view of the test socket of FIG. 2.
Figure 5:
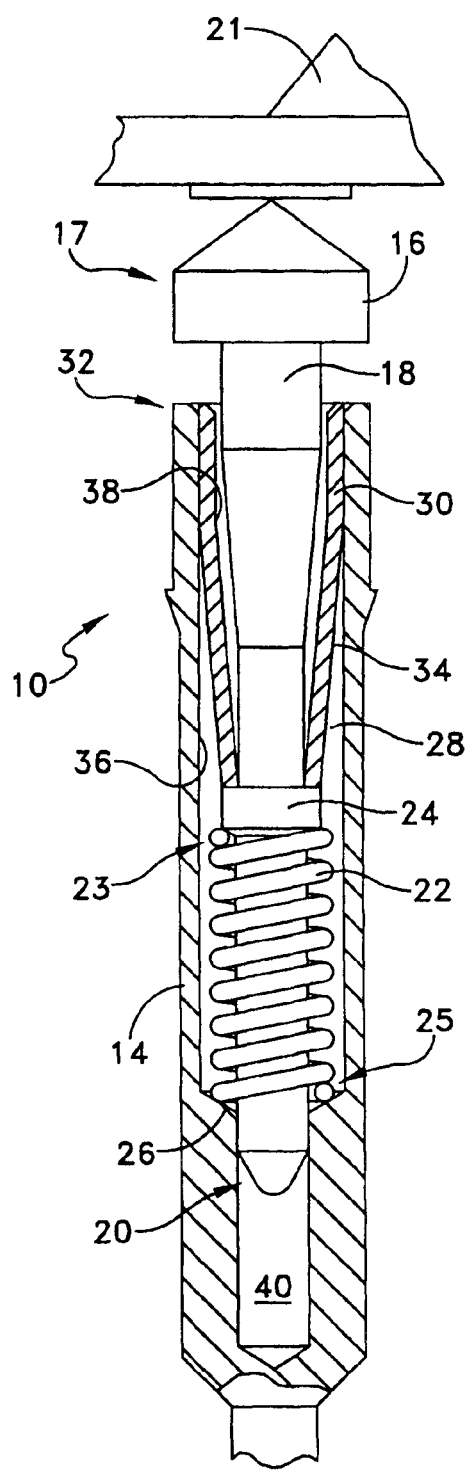
FIG. 5 is a side cross sectional view of the test socket of FIG. 2 not in compression.

Referring now to the Figures, an improved test socket 10 including a contactor assembly 12 and a terminal housing 14 for use with test assembly 11 is shown. Test assembly 11 may be any conventional test assembly including, for example, a printed circuit board 13, an insulator base 15, a guide 19, a device under test 21, and a cover 27, as is conventional. In use, the contactor assembly 12 is disposed within the terminal housing 14 such that the contactor moves substantially in an up and down, or axial direction (arrow "A", FIG. 6), so as to maintain the contactor substantially perpendicular with respect to the test assembly, as described in greater detail below. In addition, the contactor assembly is in electrical contact with the terminal housing 14, so that a direct electrical path is formed between the device under test (DUT) and the printed circuit board, without the primary electrical path going through spring 22 of the contactor assembly, as also described in greater detail below. As used herein, the term "device under test" is intended to mean any type of device which may be under test including, for example, a pin grid array (PGA), a ball grid array (BGA), or a land grid array (LGA). Also as used herein, the term "substrate" is intended to mean any base member having electrical contact areas including, but not limited to, printed circuit boards.

In the present embodiment, contactor assembly 12 preferably includes a head 16 at its engaging end 17, the head being configured to accept the DUT, such as a BGA or land grid array LGA, as would be known to those of skill in the art. Extending from and supported by the head 16 is pin 18, which includes a distal end 20 opposite engaging end 17, the pin being inserted within terminal housing 14 during use. Contactor assembly 12 further includes a biasing member, such as spring 22, which is disposed about the distal end of the pin 18 and which, when inserted within the terminal housing 14, is retained at its first end 23 against shoulder 24, and at its second end 25 against a shelf 26 formed within the terminal housing 14. The spring 22 may preferably be provided in order to improve the pressurized engagement of the engaging end of the test socket with the DUT and to provide a uniform stroke without fatigue. The spring may also increase the pressure between the distal end of the terminal and the substrate, such as a printed circuit board.

As shown in the Figures, the terminal housing 14 preferably includes a bore 28 dimensioned to receive a retainer 30 therein. Retainer 30 may preferably be positioned within the retaining or proximal end 32 of the terminal housing 14, and is preferably dimensioned such that the spring leaves or fingers 34 of the retainer 30 contact the interior wall 36 of the terminal housing, for example by press fitting the retainer within the terminal housing, as is known in the art. In the present embodiment, the retainer 30 preferably further includes a tapered inner diameter or wall 38, which tapers toward the distal end 39 of the retainer, and which is dimensioned to receive the pin 18 of the contactor assembly. The spring leaves 34 of the retainer apply a frictional force to the pin sufficient to retain pin, as is known in the art. In use, the pin 18 may preferably be inserted and guided through the retainer 30 such that shoulder 24 abuts the distal tapered end 39 of the retainer, and second end 25 of spring 22 rests on shelf 26. In the present embodiment, shelf 26 is preferably formed within the terminal member 14 between bore 28 and counterbore 40. Counterbore 40 is in communication with and extends from bore 28, and is sized to receive the distal end 20 of the pin 18. The counterbore 40 is preferably dimensioned such that the pin 18 frictionally engages the counterbore 40 during use. A conductive lubricant (not shown) may also be provided inside bore 40 and distal end 20, if desired. By utilizing retainer 30 adjacent the engaging end to guide the contactor, shoulder 24 and shelf 26 to guide and support spring 22, and counterbore 40 to slidably receive and restrict movement of the pin, movement of the contactor in any direction other than axial is minimized. When the contactor assembly is placed under compression during testing, the pin moves substantially in an up and down, or axial direction (arrow "A", FIG. 6), with little or no movement in other directions, i.e. little or no "wobbling", thereby maintaining the contactor assembly substantially perpendicular with respect to the test assembly. Thus, the contactor remains substantially centered within the terminal member 14 at both its engaging end 17 and its distal end 20. By limiting non-axial movement of the pin and maintaining it substantially centered within the terminal member, a more consistent pressure is achieved along with improved electrical continuity compared to prior art terminals.

Figure 6:
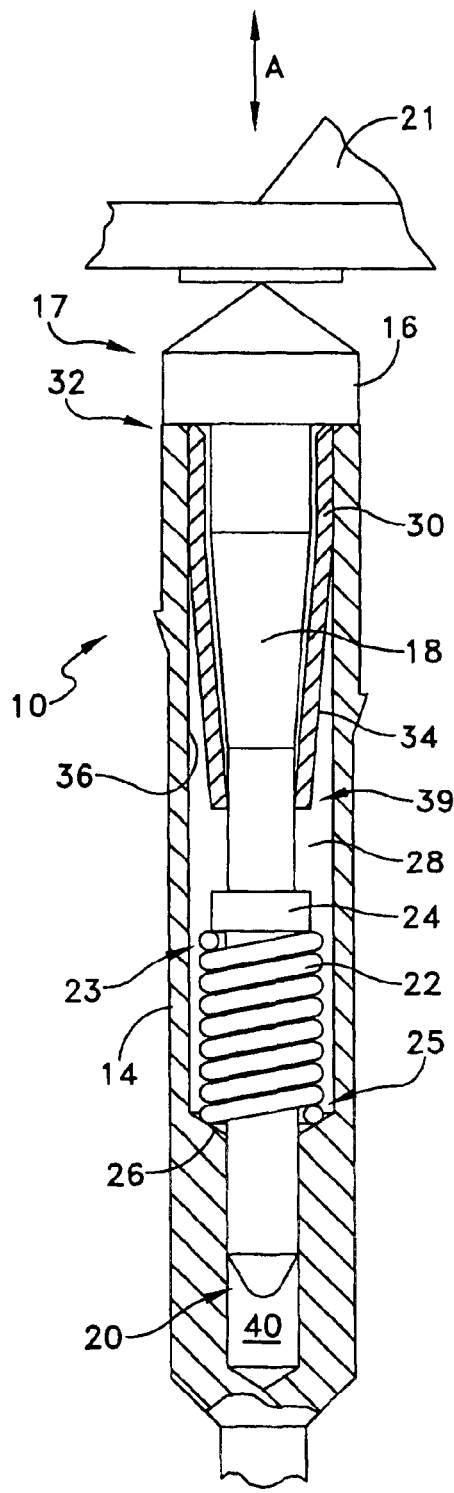
FIG. 6 is a side cross sectional view of the test socket of FIG. 2 under compression.

In addition to restricting non-axial movement, the test socket of the present embodiment also preferably provides a direct electrical path between the DUT and the substrate, such as printed circuit board 13. To provide a direct electrical path, the engaging end 17 of contactor assembly 12 is in contact with the DUT, while the distal end 20 of pin 18 is in frictional engagement with the terminal housing 14. As best shown in FIG. 6, as the distal end of pin 18 moves within counterbore 40, it frictionally engages the walls of the counterbore so that electrical current flows from the DUT, through the engaging end 17 of the contactor, through the distal end 20 of the pin 18 to the terminal housing 14 and then to the circuit board 13. This improves the electrical resistance over devices where the current flows through the spring. Alternately, the engaging end 17 of the contactor assembly 12 is preferably in electrical contact with the retainer 30 during use. The retainer, in turn, is preferably in electrical contact with the terminal housing. The engaging end of the contactor assembly maybe in contact with the DUT and in frictional engagement with the retainer, such that electrical current flows from the DUT, through engaging end of the contactor, through the retainer to the terminal housing, and then to the circuit board.

Referring now to FIGS. 7 and 8, alternate embodiments of the test socket 10 are shown. Elements which are the same or similar to those described in the first embodiment utilize the same reference number in FIGS. 7 and 8. In the embodiment of FIG. 7, all elements are the same as described with respect to the first embodiment, except that the distal end of the terminal member 14 is illustrated as a flat foot 42 instead of a pin 39 as shown in the first embodiment. With respect to FIG. 8, all elements are also the same as described with respect to the first embodiment, except for the distal end of the terminal member 14 which includes a ball 44 and a ball retainer 46, and the head 16 which is illustrated as a ball grid array retainer including a cup 48 constructed to hold ball 50, as known in the art.

Figure 9:
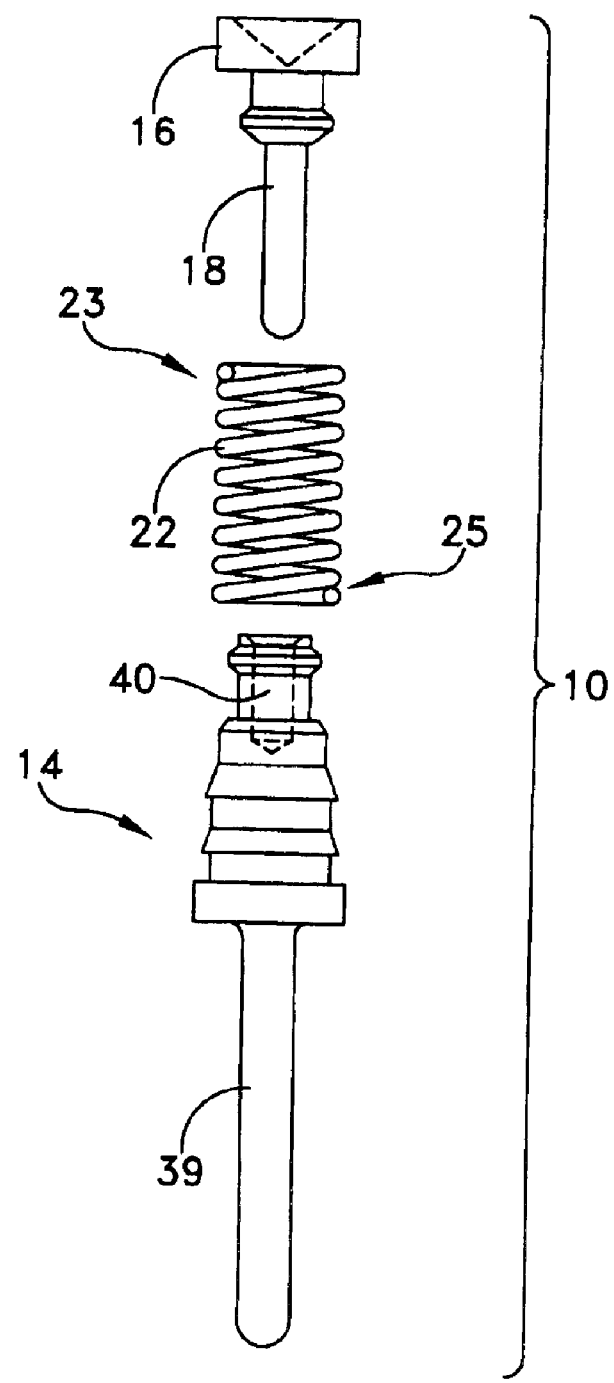
FIG. 9 is an exploded view of a third alternate embodiment of the test socket according to the invention.
Figure 10:
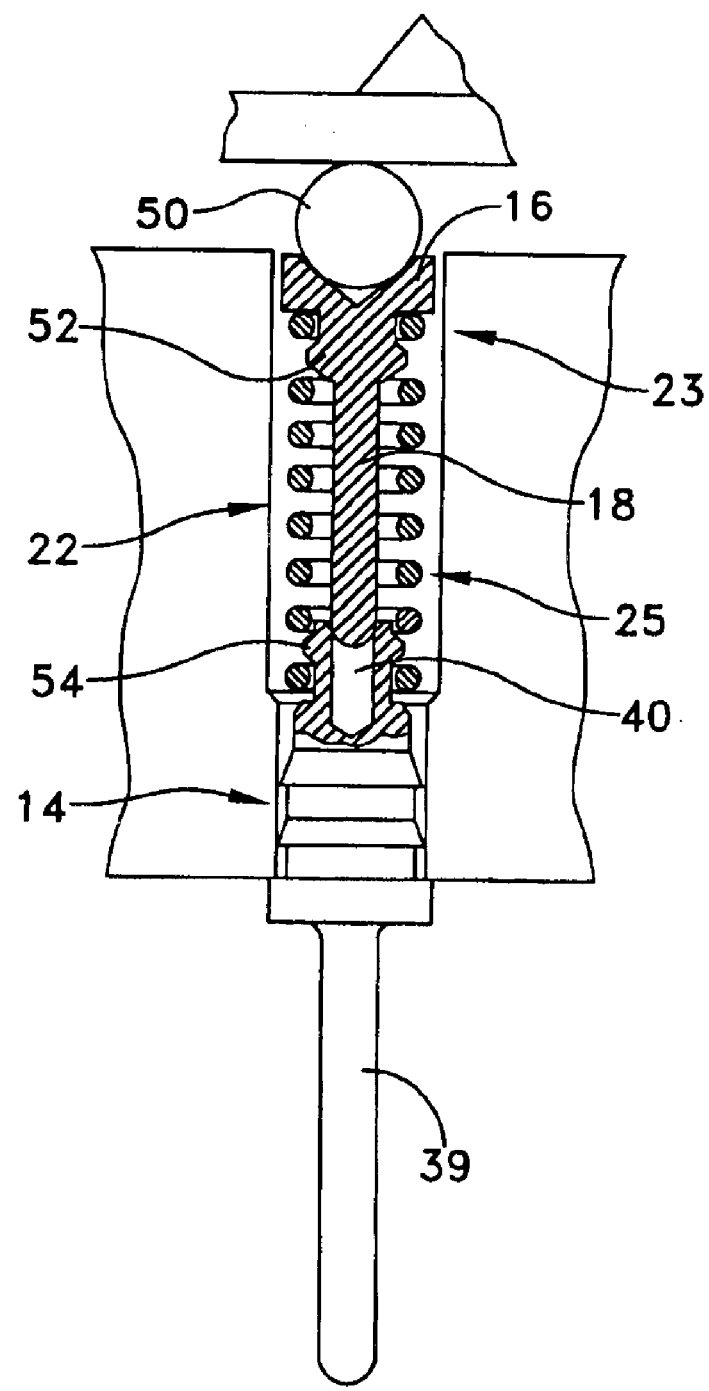
FIG. 10 is a side cross sectional view of the test socket of FIG. 9.

A third alternate embodiment of the test socket 10 is illustrated in FIGS. 9–10. Likewise, in this embodiment, elements which are the same or similar to those described in the first embodiment utilize the same reference number. As best shown in FIG. 10, the first end 23 of spring 22 rests against the bottom of head 16 and is preferably held in place by a first shoulder or barb 52, which is supported between the head 16 and the pin 18. In addition, terminal housing 14 includes a second shoulder or barb 54 which retains the second end 25 of spring 22. Bore 40 extends through the second barb 54 in the present embodiment. As can be seen, once the spring is engaged by the first and second barbs 52, 54 the pin 18 will remain within the bore 40 in both a compressed and non-compressed position since its movement will be limited by the movement of the spring between the two barbs.

Use of the test socket will now be described with reference to the Figures. In use, the head of the contactor assembly is placed in contact with the device under test. The head may be configured in a variety of designs, including but not limited to a cup, counterbase or countersink to accept a BGA, or a single pointed, multipointed, spear or chisel shape to contact a flat LGA, as would be known in the art. The pin of the contactor assembly is inserted through the retainer which is disposed within the proximal end of the terminal housing, and into the bore of the terminal housing. At least a portion of the distal end of the pin extends through the counterbore of the terminal housing, in contact with the interior wall of the counterbore, so as to restrict non-axial movement of the distal end of the pin and to provide electrical contact. The biasing member may preferably be positioned about the distal end of the pin, such that a first end of the biasing member abuts a shoulder supported on the pin, and a second end of the biasing member may preferably be supported on the shelf formed between the bore and counterbore. An insulator may also be provided into which the contactor assembly is held, as would be known in the art. A guide accurately positions the device under test and a cover is also provided, which is attached to the guide and base after the DUT is placed on top of the base, as also known in the art. Several devices may be provided for compressing the cover on top of the DUT so that the contactors are compressed to make electrical contact between the device under test and the substrate or printed circuit board. As the contactors are compressed, the retainer and counterbore restrict non-axial movement of the contactor assembly, while the electrical current preferably flows directly from the DUT, through engaging end of the contactor, to the pin and the terminal housing, and then to the circuit board without going through the spring.

As will be appreciated, the test socket described herein provides stable axial alignment in order to improve the testing of the device under test, by improving the electrical continuity compared to prior art terminals, and also provides a direct electrical path from the device under test to the printed circuit board to improve the electrical resistance.

It will be understood that various modifications may be made to the embodiment disclosed herein. For example, the engaging end may be configured in any of a variety of designs, as would be known in the art, other than disclosed herein. In addition, the axial movement may be restricted without the electrical current traveling directly from the DUT to the substrate, i.e. it may travel through a spring, and vice versa. Therefore, the above description should not be construed as limiting, but merely as exemplifications of a preferred embodiment. Those skilled in the art will envision other modifications within the scope, spirit and intent of the invention.

What is claimed is:

1. A test socket constructed and arranged to make electrical contact between a device under test and a substrate, the test socket comprising:
    a contactor assembly including an engaging end and further including:
        a) a head constructed and arranged to electrically contact the device under test;
        b) a pin extending from the head and terminating in a distal end;
    a terminal housing including a bore constructed and dimensioned to receive the pin, and a reduced diameter counterbore in communication with the bore, the counterbore being constructed and dimensioned to receive the pin therein;
    a retainer including an inner wall tapered from a proximal end of the retainer to a distal end of the retainer, the retainer being configured and dimensioned to receive the pin;
    wherein non-axial movement of the contactor assembly is minimized by the pin being received within the tapered inner wall of the retainer and the reduced diameter counterbore.

2. The test socket of claim 1, wherein the contactor assembly further includes a biasing member disposed about the distal end of the pin, the biasing member being received within the bore of the terminal housing during use.

3. The test socket of claim 2, wherein the biasing member comprises the pin and the terminal housing.

4. The test socket of claim 2, wherein the biasing member is a spring.

5. The test socket of claim 2, further comprising a shoulder supported by the pin, such that movement of the biasing member is restricted by a first end of the biasing member contacting the shoulder.

6. The test socket of claim 5, wherein a shelf is formed between the bore and counterbore such that a second end of the biasing member is supported on the shelf.

7. The test socket of claim 1, wherein the pin is in electrical contact with the device under test and the terminal housing, such that an electrical current flows from the device under test, through the distal end of the pin, to the terminal housing and to the substrate.

8. The test socket of claim 1, wherein contactor assembly is in electrical contact with the device under test and the retainer, the retainer being in electrical contact with the terminal housing, such that an electrical current flows from the device under test, through the contactor assembly, through engaging end of the contactor, to the pin and the terminal housing, and to the substrate.

9. The test socket of claim 1, wherein the device under test is selected from the group consisting of a ball grid array, a land grid array, and a pin grid array.

10. The test socket of claim 1, further comprising a conductive lubricant disposed within the bore.

11. A test socket constructed and arranged to make electrical contact between a device under test and a substrate, the test socket comprising:
    a contactor assembly including an engaging end and filter including:
        a) a head constructed and arranged to electrically contact the device under test;
        b) a pin extending from the head and terminating in a distal end;
    a terminal housing including a bore sized to receive the distal end of the pin, the distal end of the pin and an interior wall of the bore being in electrical contact;
    a retainer including an inner wall tapered from a proximal end of the retainer to a distal end of the retainer, the retainer being configured and dimensioned to receive the pin;
    wherein non-axial movement of the contactor assembly is minimized by the pin being received within the tapered inner wall of the retainer and in contact with the inner wall of the bore.

12. The test socket of claim 11, wherein the contactor assembly further includes a biasing member disposed about the pin.

13. The test socket of claim 12, further comprising a first barb disposed between the head and a proximal end of the pin, the first barb constructed and arranged to retain a first end of the biasing member during use.

14. The test socket of claim 13, wherein the terminal housing includes a second barb extending therefrom, the second barb being constructed and arranged to retain a second end of the biasing member during use.

15. The test socket of claim 14, wherein the pin is retained within the bore in both a compressed and a non-compressed position by the first end of the biasing member being retained by the first barb and the second end of the biasing member being retained by the second barb.

16. The test socket of claim 11, further comprising a conductive lubricant disposed within the bore.

* * * * *